(12) United States Patent
Siniscalchi et al.

(10) Patent No.: US 7,061,332 B2
(45) Date of Patent: Jun. 13, 2006

(54) PROCESS TRACKING LIMITER FOR VCO CONTROL VOLTAGES

(75) Inventors: Patrick P. Siniscalchi, Sachse, TX (US); Alexander N. Teutsch, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 10/954,932

(22) Filed: Sep. 30, 2004

(65) Prior Publication Data

US 2006/0071715 A1    Apr. 6, 2006

(51) Int. Cl.
*H03L 7/06* (2006.01)
*H03L 5/00* (2006.01)
*G05D 23/24* (2006.01)

(52) U.S. Cl. .................. 331/16; 331/66; 331/176; 331/183

(58) Field of Classification Search ................ 331/185, 331/186, 16, 66, 176, 183
See application file for complete search history.

(56) References Cited

U.S. PATENT DOCUMENTS

| | | | | |
|---|---|---|---|---|
| 5,719,533 | A | * | 2/1998 | Shibuya et al. ............. 331/176 |
| 5,783,956 | A | * | 7/1998 | Ooishi ........................ 327/157 |
| 6,191,660 | B1 | * | 2/2001 | Mar et al. ..................... 331/111 |
| 6,885,873 | B1 | * | 4/2005 | Ravi et al. .................... 455/517 |

OTHER PUBLICATIONS

John G. Maneatis, "Low-Jitter Process-Independent DLL and PLL Based on Self-Biased Techniques" IEEE Journal of Solid-State Circuits vol. 31, No. 11, Nov. 1996, pp. 1723-1732.

* cited by examiner

*Primary Examiner*—Robert Pascal
*Assistant Examiner*—James Goodley
(74) *Attorney, Agent, or Firm*—Alan K. Stewart; W. James Brady, III; Frederick J. Telecky, Jr.

(57) ABSTRACT

A control voltage window generator that tracks process, voltage supply, and temperature variations for a voltage controlled oscillator includes: a first transistor of a first conductivity type coupled between a supply voltage node and an upper control voltage node; and a second transistor of a second conductivity type coupled to the upper control voltage node to compensate for process variations in devices of the first conductivity type. Additionally, a target pull-in voltage generator includes circuitry for providing a pull-in control voltage that will always be inside the control voltage window, and also tracks process, voltage supply, and temperature variations.

20 Claims, 2 Drawing Sheets

PROCESS TRACKING LIMITER FOR VCO CONTROL VOLTAGES

FIELD OF THE INVENTION

The present invention relates to electronic circuitry and, in particular, to a process tracking limiter for VCO control voltages.

BACKGROUND OF THE INVENTION

In self-biased Phase-Locked Loops (PLLs) the Voltage Controlled Oscillator (VCO) will typically have very high gain, on the order of a few GHz per volt. With wide variations in operating conditions and silicon processing, the control voltage for the VCO can go through a wide range while trying to achieve lock. If the control voltage is left unlimited, the very high VCO gain can cause the VCO output frequency to go too high, to a region where the VCO itself does not have the sufficient open-loop gain to sustain oscillations. The control loop of the PLL then forces the control voltage to make the VCO run even faster, thus causing it to stay out of lock and not recover.

Prior art solutions employ either fixed limits for the VCO control voltage or ones that only track power supply changes. These solutions must keep the VCO control voltage window much wider to account for process variations. This can force the VCO into a region where it will not oscillate.

The top portion of FIG. 1 shows a typical self-biased PLL based on "Low-Jitter Process-Independent DLL and PLL Based on Self-Biased Techniques", J. G. Maneatis, Journal of Solid State Circuits, November 1996. The top portion of FIG. 1 includes input Fin; phase frequency detector (PFD) 20; dual charge pumps 22; bias generator 24; VCO 26; current mode logic (CML) dividers 28; CML to CMOS converter 30; output Fout; and source voltage VDD. To keep the VCO control voltage $V_{CTRL}$ from entering regions where the VCO may not oscillate, the circuitry in the lower portion of FIG. 1 has been added. The lower portion of FIG. 1 includes control voltage $V_{CTRL}$ comparators 32 and 34; switches 36 and 38; variable $V_{CTRL}$ window generator 40; and safe $V_{CTRL}$ generator 42 for Pull-in. If the control voltage $V_{CTRL}$ is outside the lower and upper control voltage limits Vcmpl and Vcmph, respectively, one of the two switches 36 and 38 is closed. This will pull voltage $V_{CTRL}$ into the operating window towards a target voltage. Region 44 of FIG. 1 provides limits for the control voltage.

Previous designs typically use a resistor divider from the power supply to generate control limits Vcmpl and Vcmph. This will somewhat track power supply changes, but does not follow process variations. This is not adequate for extreme operating conditions, such as automotive applications where the junction temperature can be –40 to 150° C.

SUMMARY OF THE INVENTION

A control voltage window generator that tracks process, voltage supply, and temperature variations for a voltage controlled oscillator includes: a first transistor of a first conductivity type coupled between a supply voltage node and an upper control voltage node; and a second transistor of a second conductivity type coupled to the upper control voltage node to compensate for process variations in devices of the first conductivity type. Additionally, a target pull-in voltage generator includes circuitry for providing a pull-in control voltage that will always be inside the control voltage window, and also tracks process, voltage supply, and temperature variations.

DETAILED DESCRIPTION OF PREFERRED EMBODIMENTS

The solution according to the present invention uses dynamically changing thresholds for the VCO control voltage window that tracks process variations, as well as power supply and temperature variations.

This solution makes use of the strong dependency of the self-biased PLL on process variations and moves the limits for the VCO control voltage with a similar dependency.

Therefore, it is necessary to have control limits Vcmpl and Vcmph track process variations. In self-biased PLLs, much of the process dependence is on the strength of the p-channel processing. P-channel devices are used as the resistive element in the loop filter and are the major contributor to the delay in the ring oscillator VCO. If the p-channel processing is 'weaker', voltages $V_{CTRL}$ and Vcp will be lower and voltage Vcn will be higher. Voltage Vcn sets the tail currents in the VCO and charge pumps.

Figure 2:
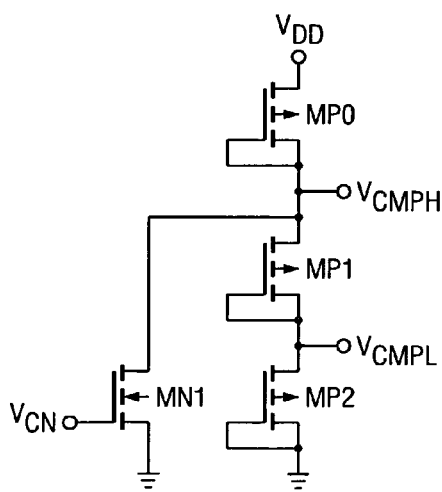
FIG. 2 is a circuit diagram of a first embodiment self-biased window generator according to the present invention.

FIG. 2 shows a $V_{CTRL}$ window generator that will track process variations in a self-biased PLL. Transistors MP0, MP1, and MP2 form a resistive divider from the power supply VDD. However, the current from transistor MN1 will move the upper limit for control voltage $V_{CTRL}$ appropriately for p-channel process variations. Control limit Vcmpl will follow a gate-to-source voltage ($V_{GS}$) drop below control limit Vcmph. Additionally, a second n-channel device with its gate tied to voltage Vcn, its source to ground, and its drain to control limit Vcmpl, can be added for more process variation tracking. Voltage Vcn is a tail current bias in the voltage controlled oscillator. Voltage Vcn moves opposite to voltages Vctrl and Vcp and is an inverse function of the p-channel drive strength.

Figure 3:
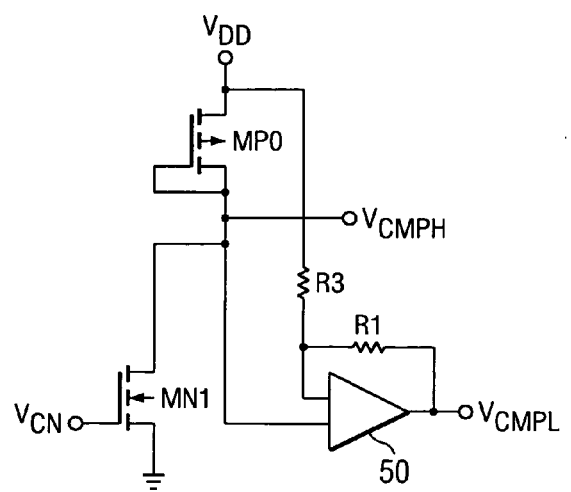
FIG. 3. is a circuit diagram of a second embodiment self-biased window generator according to the present invention.

To control the difference between control limits Vcmpl and Vcmph as a portion of the difference between source voltage VDD and control limit Vcmph, the circuit of FIG. 3 can be employed. The circuit of FIG. 3 includes transistors MN1 and MP0; resistors R1 and R3; and amplifier 50. The process variation tracking is similar to that in FIG. 2 since it also uses transistor MN1 connected to voltage Vcn. This has the capability of making the difference between control limits Vcmph and Vcmpl be less than a $V_{GS}$ voltage drop. It is important to make the $V_{CTRL}$ window as small as reasonably possible so that the VCO cannot get into a region where it cannot sustain oscillations and so that the PLL can achieve initial lock quicker—the pull-in time from outside the window is faster than the lock time while inside the window. An additional reason for a smaller control voltage window is that in some very high frequency PLLs, the circuitry after the VCO could have some ac-coupled circuits that have a high-pass pole in them. If the VCO frequency is allowed to go too low, there may not be enough signal swing through the ac-coupled circuit.

Figure 1:
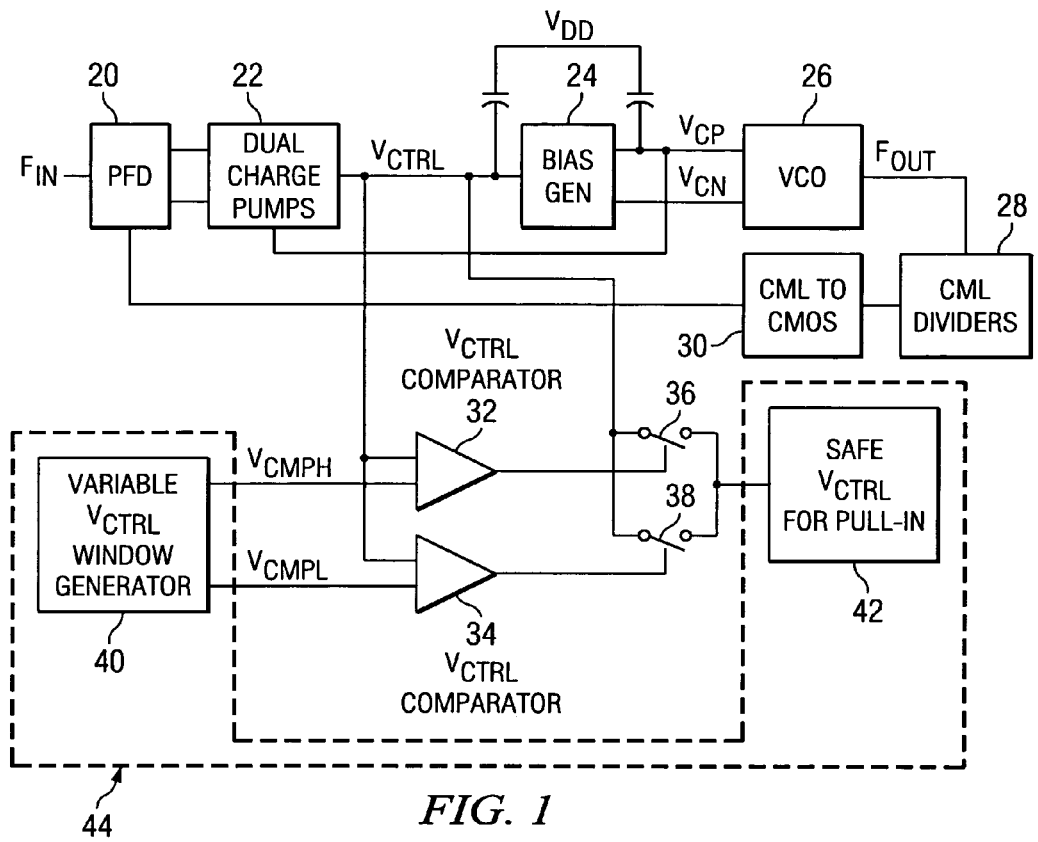
FIG. 1 is a block diagram of a self-biased PLL with a control voltage window generator.
Figure 4:
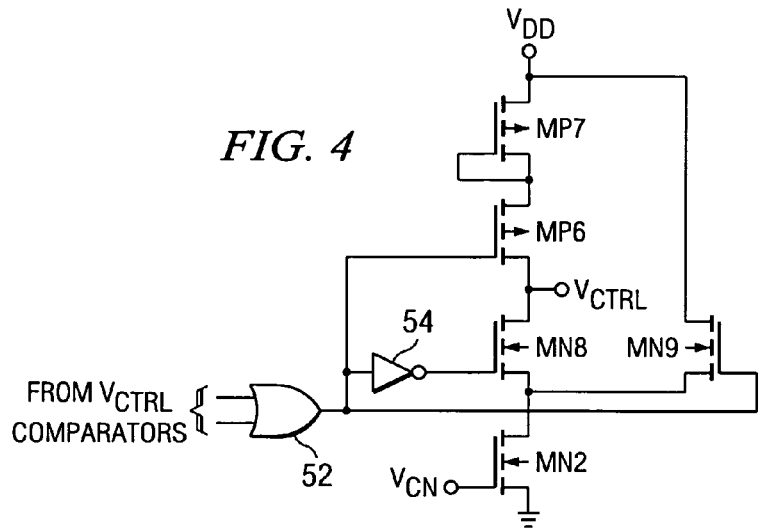
FIG. 4. is a circuit diagram of a first embodiment device for generating a target pull-in voltage that will always be inside the control voltage window according to the present invention.

It is imperative that when the VCO control voltage is outside the window that it gets pulled-in to the window so that the PLL can then lock. This means that the target voltage that control voltage $V_{CTRL}$ is pulled to must also track process variations. FIG. 4 shows a circuit for generating a target pull-in voltage that will always be inside the $V_{CTRL}$ window. The circuit of FIG. 4 provides the Safe $V_{CTRL}$ for Pull-In 42, shown in FIG. 1. The circuit of FIG. 4 includes transistors MN2, MN8, MN9, MP6, and MP7; logic gate 52; and inverter 54. Since transistor MP7 is smaller than transistor MP0 and there is some voltage drop across transistor MP6 acting as a switch, the voltage $V_{CTRL}$ target voltage will be a little less than voltage Vcmph. The switching of transistors MP6 and MP8 should be done with little charge injection to the control voltage Vctrl. Transistor MN9 is added for this reason.

Figure 5:
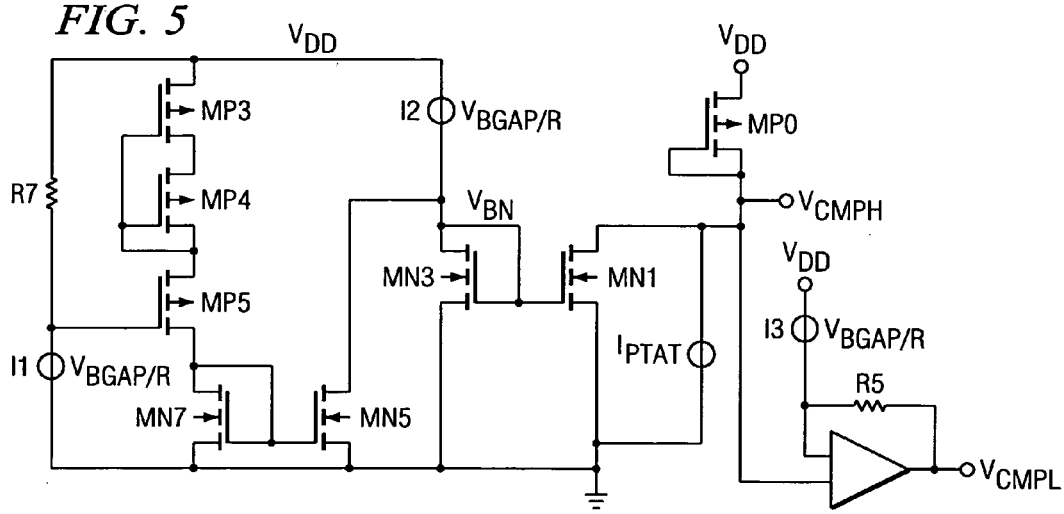
FIG. 5. is a circuit diagram of a reference-biased window generator according to the present invention.

In many instances, a self-biased PLL is used for its input frequency vs. loop bandwidth properties, even though bias circuits, such as bandgaps and current generators, exist. In these cases it can be advantageous to employ these references in creating both the window generator and the target pull-in circuit. FIG. 5 details a window generator when these bias circuits are available. The circuit of FIG. 5 includes transistors MN1, MN3, MN5, MN7, MP0, MP3, MP4, and MP5; resistors R5 and R7; current sources I1, I2, I3 and $I_{PTAT}$; and amplifier 56. The currents Vbgap/R are developed from a bandgap reference voltage and an on-chip resistor. Using this current I1 through resistor R7, a bandgap voltage is generated and applied to the stack of transistors MP3, MP4, and MP5 to develop a current that's proportional to p-channel strength. This current is subtracted from another Vbgap/R current I2 at node $V_{BN}$. Transistor MN1 mirrors this current to transistor MP0. To compensate for temperature variations, a PTAT (proportional to absolute temperature) current $I_{PTAT}$ is added to the current from transistor MN1. The difference between control limits Vcmph and Vcmpl can be accurately controlled by applying a Vbgap/R current I3 through resistor R5. This will make the voltage difference temperature independent.

Figure 6:
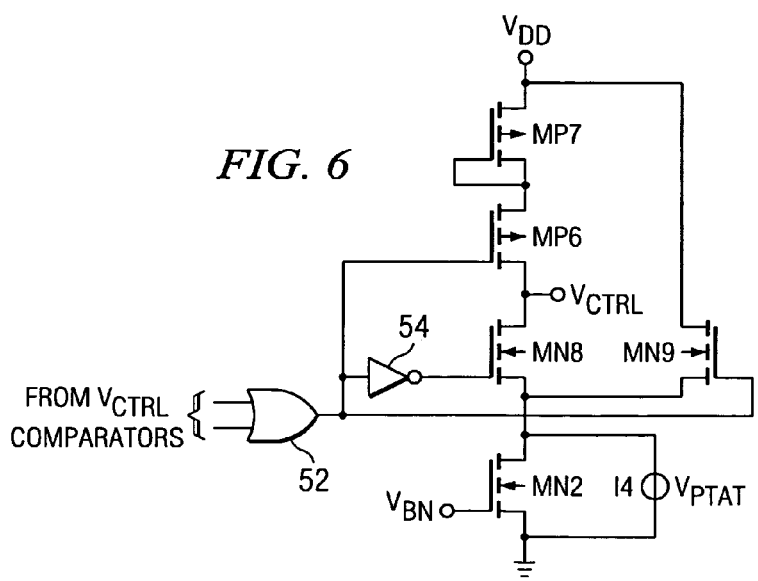
FIG. 6. is a circuit diagram of a second embodiment device for generating a target pull-in voltage, when reference biases are available, that will always be inside the control voltage window according to the present invention.

To generate the target pull-in voltage $V_{CTRL}$ when reference biases exist, currents developed from mirrors of currents $I_{MN1}$ and $I_{PTAT}$ can be used as in FIG. 6. The circuit of FIG. 6 is similar to the circuit of FIG. 4 with the addition of current source I4 which is an $I_{PTAT}$ current source. Also, voltage $V_{BN}$ (from FIG. 5) is applied to the gate of transistor MN2 instead of voltage Vcn in FIG. 4. This will have the same tracking properties as in FIG. 4.

This solution will keep the window for the VCO control voltage more narrow around its process dependent operating point. This keeps the VCO frequency range limited so that it will not reach a point where it will not oscillate due to insufficient loop gain. Also, when the VCO control voltage is outside of the window, the control voltage is pulled more rapidly into the narrow window where it then proceeds to lock in a normal (slower) fashion, the PLL will tend to lock more quickly when the control voltage is at either supply rail. Keeping the window dynamic and narrow also has the added advantage of limiting the VCO frequency which can simplify the design of the blocks that follow the VCO.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for providing a control voltage window for a voltage controlled, oscillator comprising:
   a first p channel device coupled between a supply voltage node and an upper control voltage node;
   a first n channel device coupled to the upper control voltage node to compensate for p channel process variations;
   a second channel device coupled between the upper control voltage node and a lower control voltage node;
   a third channel device coupled to the lower control voltage node wherein the first, second, and third p channel devices are coupled in series between the supply voltage node and a ground node; and
   an amplifier having a first input coupled to the supply voltage node, a second input coupled to the upper control voltage node, and an output coupled to a lower control voltage node; and
   a first resistor coupled between the first input of the amplifier and the output of the amplifier.

2. A circuit for providing a control voltage window for a voltage controlled oscillator comprising:
   a first p channel device coupled between a supply voltage node and an upper control voltage node;
   a first n channel device coupled to the upper control voltage node to compensate for p channel process variations;
   an amplifier having a first input coupled to the supply voltage node, a second input coupled to the upper control voltage node, and an output coupled to a lower control voltage node; and
   a first resistor coupled between the first input of the amplifier and the output of the amplifier.

3. The circuit of claim 2 further comprising a second resistor coupled between the supply voltage node and the first input of the amplifier.

4. The circuit of claim 2 further comprising a bandgap current source coupled between the supply voltage node and the first input of the amplifier.

5. The circuit of claim 4 further comprising a proportional-to-absolute-temperature current source in parallel with the first n channel device.

6. The circuit of claim 4 further comprising:
   a second n channel device coupled to the first n channel device such that a current in the second n channel device is mirrored to the first n channel device; and
   a bandgap current source coupled to the second channel device.

7. The circuit of claim 6 further comprising:
   a third n channel device coupled in parallel with the second n channel device;
   a fourth n channel device coupled to the third n channel device such that a current in the fourth n channel device is mirrored to the third n channel device;
   a stack of p channel devices coupled to the fourth n channel device; and
   a bandgap voltage source coupled to a control node of the stack of p channel devices to develop a current that's proportional to p-channel strength.

8. The circuit of claim 7 wherein the bandgap voltage source comprises a bandgap current source in series with a resistor.

9. A control voltage window generator for a voltage controlled oscillator comprising:
- a resistive divider of a first conductivity type coupled to a power supply node, and having an upper control voltage output node and a lower control voltage output node;
- a first transistor of a second conductivity type coupled to the upper control voltage node and having a control node coupled to a tail current bias in the voltage controlled oscillator to compensate for process variations in devices of the first conductivity type; and
- an amplifier having a first input coupled to the supply voltage node, a second input coupled to the upper control voltage node, and an output coupled to a lower control voltage node; and
- a first resistor coupled between the first input of the amplifier and the output of the amplifier.

10. The circuit of claim 9 wherein the resistive divider comprises:
- a first transistor coupled between the power supply node and the upper control voltage output node;
- a second transistor coupled between the upper control voltage output node and the lower control voltage output node; and
- a third transistor coupled to the lower control voltage output node such that the first, second, and third transistors are coupled in series and are of the first conductivity type.

11. A circuit for providing a control voltage window for a voltage controlled oscillator comprising:
- a first transistor having a first conductivity type and coupled between a supply voltage node and an upper control voltage node;
- a second transistor having a second conductivity type coupled to the upper control voltage node to compensate for process variations;
- an amplifier having a first input coupled to the supply voltage node, a second input coupled to the upper control voltage node, and an output coupled to a lower control voltage node; and
- a first resistor coupled between the first input of the amplifier and the output of the amplifier.

12. The circuit of claim 11 further comprising a second resistor coupled between the power supply node and the first input of the amplifier.

13. The circuit of claim 11 further comprising a bandgap current source coupled between the power supply node and the first input of the amplifier.

14. The circuit of claim 11 further comprising a proportional-to-absolute-temperature current source in parallel with the second transistor.

15. The circuit of claim 11 further comprising:
- a third transistor having the second conductivity type and coupled to the second transistor such that a current in the third transistor is mirrored to the second transistor; and
- a bandgap current source coupled to the third transistor.

16. The circuit of claim 15 further comprising:
- a fourth transistor having the second conductivity type and coupled in parallel with the third transistor;
- a fifth transistor having the second conductivity type coupled to the fourth transistor such that a current in the fifth transistor is mirrored to the fourth transistor;
- a stack of transistors having the first conductivity type and coupled to the fifth transistor; and
- a bandgap voltage source coupled to a control node of the stack of transistors to develop a current that's proportional to a strength of transistors of the first conductivity type.

17. The circuit of claim 16 wherein the bandgap voltage source comprises a bandgap current source in series with a resistor.

18. A target pull-in control voltage circuit for a voltage controlled oscillator comprising:
- a first transistor of a first conductivity type coupled to a supply voltage node;
- a second transistor of the first conductivity type coupled to the first transistor;
- a third transistor of a second conductivity type coupled to the second transistor;
- a fourth transistor of the second conductivity type coupled to the third transistor to compensate for process variations such that the first, second, third, and fourth transistors are coupled in series;
- a fifth transistor of the second conductivity type coupled between the power supply node and a node between the third and fourth transistors; and
- a logic gate having an output coupled to a control node of the second transistor, to a control node of the fifth transistor, and inversely coupled to a control node of the third transistor.

19. The circuit of claim 18 further comprising a proportional-to-absolute-temperature current source coupled in parallel with the fourth transistor.

20. The circuit of claim 18 wherein the first and second transistors are p channel transistors, and the third, fourth, and fifth transistors are n channel transistors.

* * * * *